(12) United States Patent
Lin

(10) Patent No.: US 9,008,733 B2
(45) Date of Patent: Apr. 14, 2015

(54) MOBILE TERMINAL AND SHUTDOWN DEVICE AND METHOD THEREOF

(75) Inventor: Zihua Lin, Huizhou (CN)

(73) Assignee: Huizhou TCL Mobile Communication Co., Ltd., Huizhou, Guangdong (CN)

( * ) Notice: Subject to any disclaimer, the term of this patent is extended or adjusted under 35 U.S.C. 154(b) by 444 days.

(21) Appl. No.: 13/505,431

(22) PCT Filed: May 18, 2011

(86) PCT No.: PCT/CN2011/074220
§ 371 (c)(1),
(2), (4) Date: May 1, 2012

(87) PCT Pub. No.: WO2012/022177
PCT Pub. Date: Feb. 23, 2012

(65) Prior Publication Data
US 2012/0214557 A1 Aug. 23, 2012

(30) Foreign Application Priority Data

Aug. 18, 2010 (CN) .......................... 2010 1 0261492

(51) Int. Cl.
*H04B 1/38* (2006.01)
*G06F 1/26* (2006.01)
*H03K 17/22* (2006.01)
*H04M 1/725* (2006.01)

(52) U.S. Cl.
CPC ................ *G06F 1/26* (2013.01); *H03K 17/223* (2013.01); *H04M 1/7258* (2013.01)

(58) Field of Classification Search
USPC .......... 455/571–574; 323/271, 272, 282, 238; 315/149
See application file for complete search history.

(56) References Cited

U.S. PATENT DOCUMENTS

2006/0166707 A1* 7/2006 Kim .............................. 455/572
2008/0100144 A1 5/2008 Chen

FOREIGN PATENT DOCUMENTS

| CN | 201213306 Y | 3/2009 |
|---|---|---|
| CN | 101982960 A | 3/2011 |
| CN | 201781519 U | 3/2011 |
| JP | 2005332258 A | 12/2005 |

OTHER PUBLICATIONS

SIPO Office Action, dated Feb. 27, 2013, for CN priority application 201010261492.1, corresponding to the current U.S. Appl. No. 13/505,431.
PCT International Search Report, dated Aug. 25, 2011 for the current U.S. Appl. No. 13/505,431.

* cited by examiner

*Primary Examiner* — Wayne Cai
(74) *Attorney, Agent, or Firm* — Shimokaji IP

(57) ABSTRACT

The present invention relates to mobile terminal technologies and describes a mobile terminal and shutdown device and a method thereof, the shutdown device comprising a power on-off key and a time delay circuit, and the shutdown device further comprising a first inductor and a first MOS tube that is connected with the main control chip; wherein the time delay circuit is used to adjust device parameters by setting a delay time. If the power on-off key is pressed for longer than the delay time, the first inductor controls the first MOS tube to cut off the connection with the main control chip, thereby shutting down.

20 Claims, 1 Drawing Sheet

MOBILE TERMINAL AND SHUTDOWN DEVICE AND METHOD THEREOF

FIELD OF THE INVENTION

The present invention relates to mobile terminal technologies and more specifically, to a mobile terminal and shutdown device and method thereof.

DESCRIPTION OF THE RELATED ART

Along with the continuous development of mobile terminal technologies, users are imposing higher and higher requirements on mobile terminal functions.

According to the prior art, the typical method designed to turn on portable hardware, such as cell phones, is for a user to press on a power on-off key to activate a power management unit (PMU). The PMU supplies power to the main control chip BB and, at the same time, notifies BB to start up. When BB completes its normal startup operations, it outputs a HOLD signal to the PMU, notifying the PMU that the system has been started and the entire system startup is completed. During normal device operations, the HOLD signal will be constantly maintained. If BB is not activated normally during the system startup, no HOLD signal will be output. If the PMU does not receive a HOLD signal within a certain period after it is activated, it will automatically shut down; if the HOLD signal is cut off during device operations, the PMU will also be automatically shut down. The power to the entire system will consequently be shut down and the system will shut down.

In some circumstances, mobile terminals, such as cell phones, could encounter issues like system freezing or even the failure of the on-off key to function. The device could not be shut down and restarted using the normal on-off key. In such circumstances, it is often necessary to open up the device case, take out the battery to shut down, and then reload the battery for restart since the on-off key is not functioning. Due to case designs, it is very difficult to take cases apart for some cell phones or portable devices.

Methods to provide a method of normal shutdown even in abnormal conditions of a mobile terminal is one of the research directions in the field of mobile terminal technologies.

SUMMARY OF THE INVENTION

An object of the present invention is to provide a mobile terminal shutdown device so as to achieve normal shutdown even in abnormal conditions of a mobile terminal.

According to one aspect of the present invention, a mobile terminal shutdown device comprises a power on-off key; a time delay circuit; a first inductor; and a first MOS tube that is connected with a main control chip; wherein the time delay circuit is adapted to adjust device parameters by setting a delay time and, if the power on-off key is pressed for longer than the delay time, the first inductor controls the first MOS tube to cut off a connection with the main control chip, thereby shutting down the mobile terminal.

According to another aspect of the present invention, a mobile terminal comprises a shutdown device, the shutdown device comprising a power on-off key; a time delay circuit; a first inductor; and a first MOS tube that is connected with a main control chip; wherein the time delay circuit is used to adjust device parameters by setting a delay time and, if the power on-off key is pressed for longer than the delay time, the first inductor controls the first MOS tube to cut off the connection with the main control chip, thereby shutting down the mobile terminal.

In some embodiments, the time delay circuit comprises a first resistor and a first capacitor, the first resistor and the first capacitor being connected with the first inductor.

In some embodiments, the delay time is longer than a time that the power on-off key is pressed for normal start/shutdown of the mobile terminal.

According to a further aspect of the present invention, a mobile terminal shutdown method for a mobile terminal comprising a time delay circuit comprises adjusting device parameters by setting a delay time; and if the power on-off key is pressed for longer than the delay time, a first inductor of the mobile terminal controls a first MOS tube of the mobile terminal to cut off a connection with a main control chip, thereby shutting down the mobile terminal, wherein the main control chip is connected with the first MOS tube.

In some embodiments, the mobile terminal is frozen prior to activating the shutdown method.

In some embodiments, the mobile terminal is restarted without removing a battery of the mobile terminal.

DETAILED DESCRIPTION OF THE PREFERRED EMBODIMENT

To make the objects, technology and advantages of the present invention more clearly understood, the present invention is further described in detail below with reference to the accompanying drawings and an embodiment. It should be understood that the specific embodiment described herein is only intended to explain the present invention, not to limit the present invention.

Figure 1:
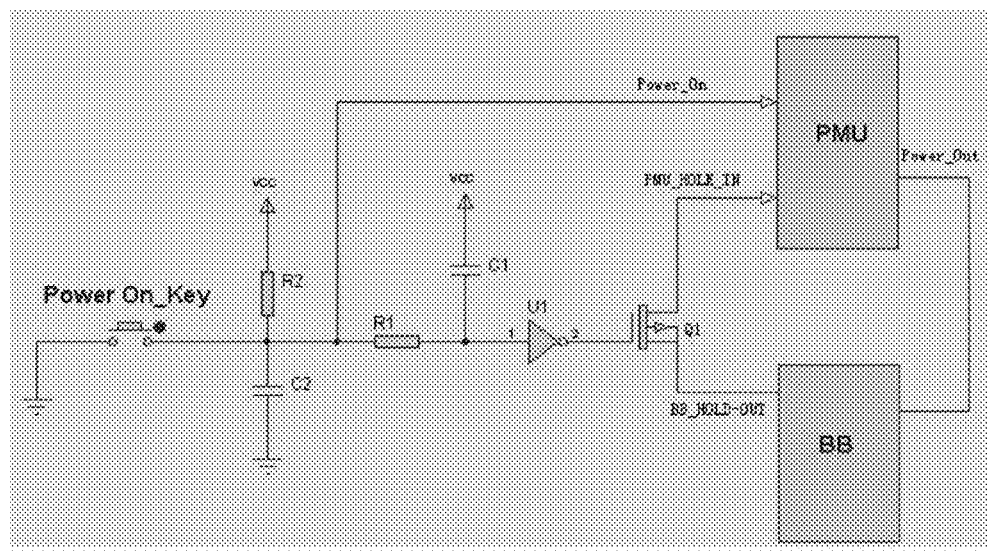
FIG. 1 illustrates the structure of a mobile terminal shutdown device according to an embodiment of the present invention.

FIG. 1 illustrates the structure of a mobile terminal shutdown device according to an embodiment of the present invention.

The shutdown device comprises a power on-off key Power On_Key and a time delay circuit, and the shutdown device further comprises a first inductor UI and a first MOS tube Q1 that is connected with a main control chip BB. The time delay circuit is used to adjust device parameters by setting a delay time. If the power on-off key Power On_Key is pressed for longer than the delay time, the first inductor U1 controls the first MOS tube Q1 to cut off the connection with the main control chip BB, thereby shutting down the mobile terminal.

The time delay circuit comprises a first resistor R1 and a first capacitor C1, the first resistor R1 and the first capacitor C1 are connected with the first inductor U1. The delay time is set to be longer than the time that the key is pressed for normal start/shutdown of the terminal. R1 and C1 form the time delay circuit that can adjust device parameters by setting a delay time. If the normal time of pressing down the Power On_Key to shut down is 3.0 s, the delay time set in the embodiment of the present invention is 4.7 s. When the power on-off key Power On_Key fails to function, the power on-off key Power On_Key is pressed for 4.7 s, then the input of the first capacitor C1 is lowered, which shuts down the first MOS tube Q1 via U1, consequently cutting off the HOLD signal from BB to the PMU.

Some embodiments of the present invention make full use of the role of the HOLD signal. When the power on-off key Power On_Key fails to function, the power on-off key Power On_Key is pressed for a long period to cut off the connection with the main control chip BB via the time delay circuit which cuts off the HOLD signal from the main control chip BB, and, in turn, shuts down the PMU, cutting off the power and shutting down the mobile terminal. For devices with complex case design or difficulty in disassembly, the system can be shut down when frozen without the need to take the case apart, allowing the mobile terminal to be restored.

Some embodiments of the present invention provide a mobile terminal, the mobile terminal comprising a shutdown device, according to an embodiment of the present invention, which will not be described herein in light of the above detailed description of the shutdown device.

Figure 2:
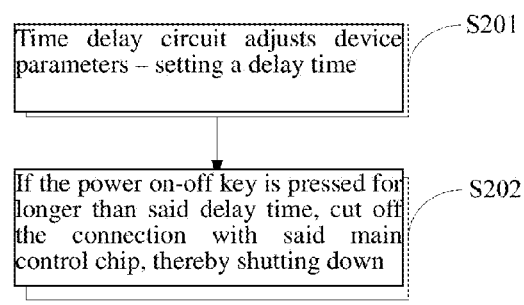
FIG. 2 is a flow chart of a mobile terminal shutdown method according to an embodiment of the present invention.

FIG. 2 illustrates the flow of a mobile terminal shutdown method according to an embodiment of the present invention.

In Step S201, the time delay circuit (R1 and C1) adjusts device parameters by setting a delay time.

In Step S202, if the power on-off key is pressed for longer than the delay time, the first inductor U1 of the terminal controls the first MOS tube of the terminal to cut off the connection with the main control chip, thereby shutting down the mobile terminal, wherein the main control chip is connected with the first MOS tube Q1.

The time delay circuit comprises a first resistor and a first capacitor, the first resistor and the first capacitor are connected with the first inductor,.

Typically, the delay time is set to be longer than the time that the key is pressed for normal start/shutdown of the terminal.

According to an embodiment of the present invention, a time delay circuit is provided, a delay time is set via the time delay circuit, and, when the key is pressed for longer than the delay time, the connection with the main control chip BB is cut off, which, in turn, cuts off the output of a HOLD signal and thus shuts down the PMU. When a mobile terminal is frozen, a user just needs to press down the key for a long period, with no need to take out the battery, leading to high efficiency and greatly improving the use thereof.

It should be understood that those skilled in the art may make improvements or modifications according to the above description, while all these improvements and modifications shall be encompassed by the claims of the present invention.

What is claimed is:

1. A mobile terminal shutdown device, comprising:
a power on-off key;
a time delay circuit, wherein the time delay circuit includes a first resistor, a second resistor, a first capacitor and a second capacitor, wherein a first end of the first capacitor is connected to a ground and a second end of the first capacitor is connected to a first end of the first resistor and a second end of the first resistor is connected to $V_{DC}$, wherein a first end of the second resistor is connected to the second end of the first capacitor and the first end of the first resistor, and wherein a first end of the second capacitor is connected to a second end of the second resistor and a second end of the second capacitor is connected to $V_{DC}$;
a first inductor; and
a first metal-oxide-semiconductor (MOS) tube that is connected with a main control chip;
wherein said time delay circuit is adapted to adjust device parameters by setting a delay time and, if said power on-off key is pressed for a first time, less than said delay time, while the mobile terminal is operating normally, the mobile terminal will shut down normally, if the mobile terminal does not shut down normally and if said power on-off key is pressed for a second time that is longer than said delay time, while the mobile terminal is experiencing an abnormal condition, said first inductor controls said first metal-oxide-semiconductor (MOS) tube to cut off a connection with said main control chip, wherein said abnormal condition includes the mobile terminal being frozen.

2. The mobile terminal shutdown device as set forth in claim 1, wherein said time delay circuit comprises a first resistor and a first capacitor, said first resistor and said first capacitor being connected with said first inductor.

3. The mobile terminal shutdown device as set forth in claim 1, wherein said delay time is longer than a time that the power on-off key is pressed for normal start/shutdown of said mobile terminal.

4. The mobile terminal shutdown device as set forth in claim 1, wherein the mobile terminal is a mobile phone.

5. The mobile terminal shutdown device as set forth in claim 1, wherein the time delay is about 4.7 seconds.

6. The mobile terminal shutdown device as set forth in claim 1, further comprising a power management unit, said first MOS tube adapted to cut off a HOLD signal from said main control chip to the power management unit.

7. A mobile terminal, comprising:
a shutdown device, said shutdown device comprising:
a power on-off key; and
a time delay circuit, wherein said time delay circuit includes first device parameters associated with a normal mode and second device parameters associated with the mobile terminal experiencing an abnormal condition, wherein the time delay circuit includes a first resistor, a second resistor, a first capacitor and a second capacitor, wherein a first end of the first capacitor is connected to a ground and a second end of the first capacitor is connected to a first end of the first resistor and a second end of the first resistor is connected to $V_{DC}$, wherein a first end of the second resistor is connected to the second end of the first capacitor and the first end of the first resistor, and wherein a first end of the second capacitor is connected to a second end of the second resistor and a second end of the second capacitor is connected to $V_{DC}$;
a first inductor; and
a first metal-oxide-semiconductor (MOS) tube that is connected with a main control chip;
wherein said time delay circuit is used to adjust the first device parameters by setting a first delay time when the mobile terminal is operating normally and setting a second delay time when the mobile terminal is experiencing an abnormal condition and, if the mobile terminal does not shut down normally prior to expiration of the first delay time and if said power on-off key is pressed for longer than said second delay time, said first inductor controls said first metal-oxide-semiconductor (MOS) tube to cut off the connection with said main control chip, wherein said second delay time is longer than said first delay time.

8. The mobile terminal as set forth in claim 7, wherein said time delay circuit comprises a first resistor and a first capacitor, said first resistor and said first capacitor being connected with said first inductor.

9. The mobile terminal as set forth in claim 7, wherein said delay time is longer than a time that the power on-off key is pressed for normal start/shutdown of said mobile terminal.

10. A mobile terminal shutdown method, for a mobile terminal comprising a time delay circuit, said method comprising the following steps:

said time delay circuit adjusts device parameters by setting a delay time based on an operation mode of the mobile terminal, wherein the operation mode of the mobile terminal is either a normal mode or an abnormal condition, wherein the time delay circuit includes a first resistor, a second resistor, a first capacitor and a second capacitor, wherein a first end of the first capacitor is connected to a ground and a second end of the first capacitor is connected to a first end of the first resistor and a second end of the first resistor is connected to $V_{DC}$, wherein a first end of the second resistor is connected to the second end of the first capacitor and the first end of the first resistor, and wherein a first end of the second capacitor is connected to a second end of the second resistor and a second end of the second capacitor is connected to $V_{DC}$;

if said power on-off key is pressed for shorter than said delay time while the mobile terminal is operating in the normal mode, the mobile terminal shuts down normally; and if the mobile terminal does not shut down normally and if said power on-off key is pressed for longer than said delay time while the mobile terminal is experiencing an abnormal condition, a first inductor of said mobile terminal controls a first metal-oxide-semiconductor (MOS) tube of said mobile terminal to cut off a connection with a main control chip, wherein said main control chip is connected with said first metal-oxide-semiconductor (MOS) tube.

11. The mobile terminal shutdown method as set forth in claim 10, wherein said time delay circuit comprises a first resistor and a first capacitor, said first resistor and said first capacitor being connected with said first inductor.

12. The mobile terminal shutdown method as set forth in claim 10, further comprising setting said delay time is to be longer than the time that the power on-off key is pressed for normal start/shutdown of said mobile terminal.

13. The mobile terminal shutdown method as set forth in claim 10, wherein the mobile terminal is frozen prior to activating the shutdown method.

14. The mobile terminal shutdown method as set forth in claim 13, further comprising restarting the mobile terminal without removing a battery of the mobile terminal.

15. The mobile terminal shutdown method as set forth in claim 10, further comprising cutting off an output of a HOLD signal to shut down a power management unit of the mobile terminal.

16. A method for shutting down a frozen mobile terminal, comprising:

providing a time delay circuit that includes a first resistor, a second resistor, a first capacitor and a second capacitor, wherein a first end of the first capacitor is connected to a ground and a second end of the first capacitor is connected to a first end of the first resistor and a second end of the first resistor is connected to $V_{DC}$, wherein a first end of the second resistor is connected to the second end of the first capacitor and the first end of the first resistor, and wherein a first end of the second capacitor is connected to a second end of the second resistor and a second end of the second capacitor is connected to $V_{DC}$ depressing a power on-off key for a period of time greater than a predetermined time delay, wherein depressing the power on-off key defines a short circuit around the first capacitor; and cutting off a HOLD signal from a main control chip to a power management unit of the mobile terminal when the mobile terminal does not shutdown prior to the predetermined time delay and when the mobile terminal is frozen, wherein the mobile terminal is experiencing an abnormal condition when the mobile terminal is frozen.

17. The method as set forth in claim 16, further comprising controlling a first metal-oxide-semiconductor (MOS) tube, with a first inductor of said mobile terminal, to cut off a connection with a main control chip, thereby shutting down the mobile terminal, wherein said main control chip is connected with said first metal-oxide-semiconductor (MOS) tube.

18. The method as set forth in claim 17, wherein said time delay circuit comprises a first resistor and a first capacitor, said first resistor and said first capacitor being connected with said first inductor.

19. The method as set forth in claim 18, further comprising adjusting capacitance and resistance of said first capacitor and said first resistor to provide a time delay greater than a time that said mobile terminal would respond when said power on-off key is depressed if the mobile terminal was operating.

20. The method as set forth in claim 19, further comprising restarting the mobile terminal without removing a battery of the mobile terminal.

* * * * *